United States Patent
Owen

(10) Patent No.: US 11,885,839 B2
(45) Date of Patent: Jan. 30, 2024

(54) METHOD AND SYSTEM FOR MAKING TIME DOMAIN MEASUREMENTS OF PERIODIC RADIO FREQUENCY (RF) SIGNAL USING MEASUREMENT INSTRUMENT OPERATING IN FREQUENCY DOMAIN

(71) Applicant: Keysight Technologies, Inc., Santa Rosa, CA (US)

(72) Inventor: Andrew Michael Owen, Lake Villa, IL (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 443 days.

(21) Appl. No.: 16/803,319

(22) Filed: Feb. 27, 2020

(65) Prior Publication Data
US 2021/0270877 A1 Sep. 2, 2021

(51) Int. Cl.
*G01R 23/16* (2006.01)
*G01R 23/02* (2006.01)
*G01R 35/00* (2006.01)

(52) U.S. Cl.
CPC ............ *G01R 23/16* (2013.01); *G01R 23/02* (2013.01); *G01R 35/005* (2013.01)

(58) Field of Classification Search
CPC ....... G01R 23/16; G01R 23/02; G01R 35/005
See application file for complete search history.

(56) References Cited

U.S. PATENT DOCUMENTS

| | | | | |
|---|---|---|---|---|
| 5,117,377 | A * | 5/1992 | Finman | G01S 7/4004 703/2 |
| 8,296,086 | B2 * | 10/2012 | Sternberg | H04B 17/21 702/66 |
| 8,805,313 | B2 * | 8/2014 | Da Silva | H04B 17/20 455/226.1 |
| 9,851,383 | B1 * | 12/2017 | Barich | G01R 23/02 |
| 9,906,248 | B2 * | 2/2018 | Gupta | H04L 27/2649 |
| 2012/0295548 | A1 | 11/2012 | Dunsmore | |
| 2014/0306719 | A1 | 10/2014 | Dunsmore et al. | |
| 2015/0226821 | A1 * | 8/2015 | Zhang | G01R 33/4816 324/309 |

OTHER PUBLICATIONS

Mohammed EL Yaagoubi et al., "Accurate phase measurements of broadband Multitone signals using a specific configuration of a Large Signal Network Analyzer," 2006 IEEE MTT-S International Microwave Symposium Digest, pp. 1448-1451.

(Continued)

*Primary Examiner* — Mohamed Charioui
*Assistant Examiner* — Lynda Dinh

(57) ABSTRACT

A system and method are provided for making time domain measurements of a wideband periodic radio frequency (RF) signal using a narrowband measurement instrument operating in a frequency domain. The method includes receiving the periodic RF signal at a single port corresponding to a receiver of the measurement instrument; determining a complex absolute signal having amplitudes and phases of spectral components of the periodic RF signal over an entire bandwidth of the periodic RF signal in the frequency domain; and reconstructing a time domain signal corresponding to the periodic RF signal by transforming the complex absolute signal from the frequency domain to the time domain.

17 Claims, 7 Drawing Sheets

(56) References Cited

OTHER PUBLICATIONS

Marwen Ben Rejeb et al., "Phase Calibration for Coherent Multi-Harmonic Modulated Signal Measurements Using Nonlinear Vector Network Analyzer," 2016 IEEE MTT-S International Microwave Symposium (IMS), pp. 1-4.

Guangyu Gao et al., "Photonics-Based Broadband RF Spectrum Measurement With Sliced Coherent Detection and Spectrum Stitching Technique." IEEE Photonics Journal, vol. 9, No. 5, Oct. 2017, pp. 1-12.

Takayuki Yamada et al., "Signal Separation and Reconstruction Method for Simultaneously Received Multi-System Signals in a Unified Wireless System," NTT Network Innovation Laboratories, NTT Corporation, CROWNCOM, 2011, Jun. 1-3, Osaka, Japan, pp. 1-5.

* cited by examiner

METHOD AND SYSTEM FOR MAKING TIME DOMAIN MEASUREMENTS OF PERIODIC RADIO FREQUENCY (RF) SIGNAL USING MEASUREMENT INSTRUMENT OPERATING IN FREQUENCY DOMAIN

BACKGROUND

Characterizing fast, periodic (modulated) radio frequency (RF) signals with wide bandwidths in the time domain typically requires a measurement instrument with an equally wide bandwidth and high sampling rate, such as oscilloscopes and wideband digitizers, for example. To measure the time domain characteristics of a fast, wideband periodic RF signal, the measurement instrument typically must acquire the entire bandwidth in a single shot at a very high sampling rate. However, measurement instruments capable of such measurements have certain drawbacks, including relatively high noise floors, limited vertical resolution, and limited numbers of ports for receiving the periodic RF signals. Also, oscilloscopes, in particular, capable of measuring wideband periodic RF signals may be very expensive.

In comparison, measurement instruments that characterize periodic RF signals in the frequency domain, such as narrowband vector network analyzers (VNAs) and general purpose spectrum analyzers (SAs), are quite sensitive and can operate at very high frequencies with easy user-defined error correction and over several ports. Also, they have lower noise floors, better signal to noise ratios (SNRs), and better vertical resolution as compared to the time domain measurement instruments. However, a narrowband VNA, for example, has an intermediate frequency (IF) bandwidth (IFBW) only in a range of tens of megahertz (MHz) or less, as compared to time domain measurement instruments with wide bandwidths in a range of multiple gigahertz (GHz).

There are wideband VNAs that are capable of acquiring the entire bandwidth of a wideband periodic RF signal in a single shot in the frequency domain, although again, such wideband VNAs are prohibitively expensive for most customers. In comparison, the more affordable narrowband VNAs and SAs can only acquire a portion or sliver of the periodic RF signal at a time due to the IFBW limitation. Also, the narrowband VNAs and SAs do not have time domain information, since they acquire only spectrum power (amplitude) in the frequency domain, and do not preserve phase information. So, conversion from the frequency domain to the time domain using an inverse fast Fourier transform (IFFT), for example, still would not provide time domain characteristics of the measured periodic RF signal.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
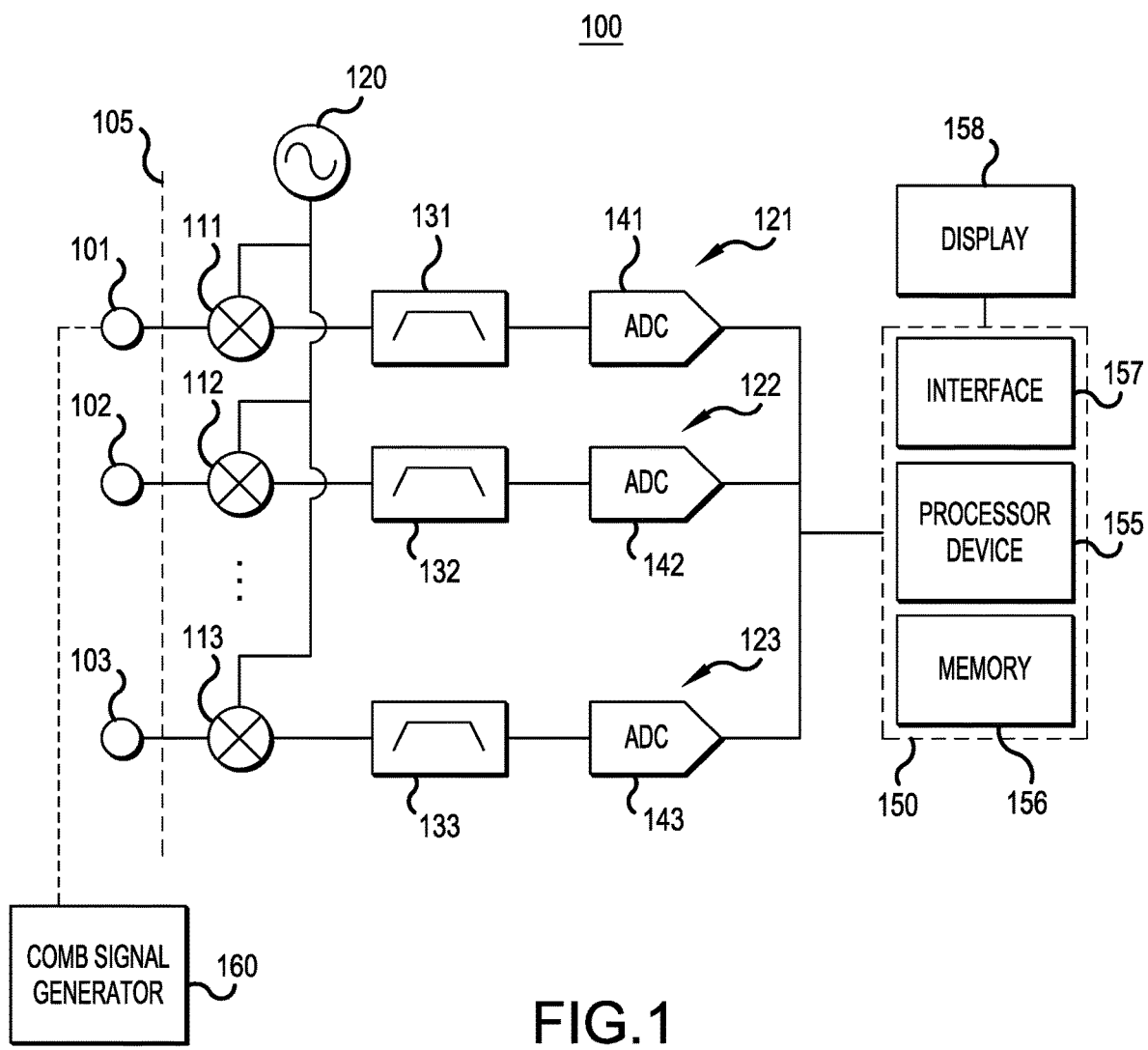
FIG. 1 is a simplified block diagram showing a system for making time domain measurements of a wideband periodic RF signal while operating in the frequency domain, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a", "an" and "the" are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Various embodiments are directed to systems and methods for performing time domain measurements of a wideband periodic radio frequency (RF) signal received at a port of a narrowband coherent receiver of a measurement instrument. Performing the measurements includes capturing amplitude and phase of the periodic RF signal in the frequency domain, and transforming the frequency domain representations of the amplitude and phase to the time domain. This enables very fine time-resolution measurements of the periodic RF signal on the narrowband measurement instrument.

According to a representative embodiment, a method is provided for making time domain measurements of a wideband RF signal using a narrowband measurement instrument operating in a frequency domain. The method includes receiving the periodic RF signal at a single port corresponding to a receiver of the measurement instrument; determining a complex absolute signal including amplitudes and phases of spectral components of the periodic RF signal over an entire bandwidth of the periodic RF signal in the frequency domain; and reconstructing a time domain signal corresponding to the periodic RF signal by transforming the complex absolute signal from the frequency domain to the time domain. The method may further include detecting a periodic characteristic in the reconstructed time domain signal, and displaying the detected periodic characteristic on a display of the measurement instrument.

FIG. 1 is a simplified block diagram showing a measurement instrument for making time domain measurements of a wideband periodic RF signal while operating in the frequency domain, according to a representative embodiment.

Referring to FIG. 1, a system 100 includes narrowband coherent receivers configured to measure periodic RF signals in the frequency domain, where a total bandwidth of each of the periodic RF signals may be wider than the available narrow bandwidth of each of the coherent receivers. The periodic RF signals are multi-tone signals, where the tones are indicated by sinusoidal signals at corresponding tone frequencies in the frequency domain. The system 100 may be implemented as a vector network analyzer (VNA) or a spectrum analyzer (SA), for example, although other types of measurement instruments capable of measuring signals in the frequency domain may be included, without departing from the scope of the present teachings. Due to their narrowband nature, VNAs in particular are very sensitive, enabling accurate measurements of the periodic RF signals even at very low signal amplitudes, which is an advantage over an oscilloscope, for example. In order to measure a periodic RF signal over its total bandwidth in the frequency domain, the system 100 may individually measure the tones or sinusoidal signals of the periodic RF signal.

The system 100 includes multiple ports for receiving the periodic RF signals, indicated by representative first port 101, second port 102 and $m^{th}$ port 103, at measurement plane 105, where m is a positive integer indicating the total number of ports of the system 100. Each of the first port 101, the second port 102 and the $m^{th}$ port 103 is an input to a corresponding coherent receiver. In the depicted embodiment, the first port 101 is connected to a first coherent receiver 121, the second port 102 is connected to a second coherent receiver 122, and the $m^{th}$ port 103 is connected to an $m^{th}$ coherent receiver 123. The system 100 further includes a local oscillator (LO) 120 for generating LO signals at different LO frequencies applied to each of the first, second and $m^{th}$ coherent receivers 121, 122 and 123, where the LO signals are mixed with the periodic RF signals to provide corresponding intermediate frequency (IF) signals.

The first coherent receiver 121 includes a first mixer 111 for mixing a first periodic RF signal received at the first port 101 and the LO signal from the LO 120 to output a first IF signal. The first coherent receiver 121 further includes a first narrowband filter 131 for bandpass filtering the first IF signal from the first mixer 111 in order to reject all sinusoidal signals (tones) other than the sinusoidal signal being measured by the particular acquisition, and a first analog to digital converter (ADC) 141 for digitizing the filtered first IF signal. The second coherent receiver 122 includes a second mixer 112 for mixing a second periodic RF signal received at the second port 102 and the LO signal to output a second IF signal, a second narrowband filter 132 for bandpass filtering the second IF signal, and a second ADC 142 for digitizing the filtered second IF signal. Likewise, the $m^{th}$ coherent receiver 123 includes an $m^{th}$ mixer 113 for mixing an $m^{th}$ periodic RF signal received at the $m^{th}$ port 103 and the LO signal to output an $m^{th}$ IF signal, an $m^{th}$ narrowband filter 133 for bandpass filtering the $m^{th}$ IF signal, and an $m^{th}$ ADC 143 for digitizing the filtered $m^{th}$ IF signal.

The system 100 may further include a harmonic comb signal generator 160 that is configured to generate comb signals, having multiple frequency tones with a known phase relationship for performing phase response calibration on one or more of the first, second and $m^{th}$ coherent receivers 121, 122 and 123, as described below. The comb signal generator 160 has a known phase response, and is able to generate multiple frequency tones with a known phase relationship among the fundamental and multiple harmonic frequencies. During the phase response calibration, the comb signal generator 160 is temporarily connected to the coherent receiver being calibrated through the corresponding port, indicated by the dotted line between the comb signal generator 160 and the first port 101. The comb signal generator 160 is disconnected upon completion of the phase response calibration.

The digitized first, second and mth IF signals are provided to a processing unit 150 for additional processing and display, including for example, determining complex absolute signals corresponding to the periodic RF signals in the frequency domain, including the amplitudes and phases of the spectral components of the periodic RF signals. The processing unit 150 also transforms the complex absolute signals from the frequency domain to the time domain so that time domain characteristics of the periodic RF signals identified using phase data determined in the frequency domain may be determined and displayed, as discussed below in detail.

The processing unit 150 includes a processor device 155, memory 156, and an interface 157, for example, and interface with a display 158. The processor device 155, together with the memory 156, implements the methods of making time domain measurements of a wideband periodic RF signal using a narrowband measurement instrument operating in the frequency domain, and may be configured to perform and/or control all or a portion of the steps of the processes shown in FIGS. 2 and 3, discussed below. In various embodiments, the processor device 155 may include one or more computer processors, digital signal processors (DSP), field-programmable gate arrays (FPGAs), application specific integrated circuits (ASICs), or combinations thereof, using any combination of hardware, software, firmware, hard-wired logic circuits, or combinations thereof. The processor device 155 may include its own processing memory (e.g., memory 156) for storing computer readable code (e.g., software, software modules) that enables performance of the various functions described herein. For example, the memory 156 may store software instructions/computer readable code executable by the processor device 155 (e.g., computer processor) for performing some or all aspects of methods described herein.

References to the processor device 155 may be interpreted to include one or more processing cores, as in a multi-core processor. The processor device 155 may also refer to a collection of processors within a single computer system or distributed among multiple computer systems, as well as a collection or network of computing devices each including a processor or processors. Programs have software instructions performed by one or multiple processors that may be within the same computing device or which may be distributed across multiple computing devices.

The processing memory, as well as other memories and databases, are collectively represented by the memory 156, and may be random-access memory (RAM), read-only memory (ROM), flash memory, electrically programmable read-only memory (EPROM), electrically erasable and programmable read only memory (EEPROM), registers, a hard disk, a removable disk, tape, compact disk read only memory (CD-ROM), digital versatile disk (DVD), registers, a hard disk, a removable disk, tape, floppy disk, blu-ray disk, or universal serial bus (USB) driver, or any other form of storage medium known in the art, which are tangible and non-transitory storage media (e.g., as compared to transitory propagating signals). Memories may be volatile or non-volatile, secure and/or encrypted, unsecure and/or unencrypted, without departing from the scope of the present teachings. As mentioned above, the memory 156 is representative of one or more memories and databases, including the processing memory, as well as multiple memories and databases, including distributed and networked memories and databases.

The interface 157 may include a user interface and/or a network interface for providing information and data output by the processor device 155 and/or the memory 156 to the user and/or for receiving information and data input by the user. That is, the interface 157 enables the user to enter data and to control or manipulate aspects of the process of measuring periodic RF signals in the frequency domain, and also enables the processor device 155 to indicate the effects of the user's control or manipulation. The interface 157 may include one or more of ports, disk drives, wireless antennas, or other types of receiver circuitry. The interface 157 may further connect one or more user interfaces, such as a mouse, a keyboard, a mouse, a trackball, a joystick, a microphone, a video camera, a touchpad, a touchscreen, voice or gesture recognition captured by a microphone or video camera, for example.

The display 158 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 158 and/or the processor device 155 may include one or more display interface(s), in which case the display 158 may provide a graphical user interface (GUI) for displaying and receiving information to and from a user.

As mentioned above, each periodic RF signal is a signal under test (SUT) that includes multiple tones with equal spacing, and thus is defined by a center frequency, a tone spacing and a number of tones. For example, the periodic RF signal may be a pulsed RF signal that has a predetermined pulse width and a pulse repetition interval (PRI) in the time domain. The periodic RF signal thus has discrete spectral lines or tones in the frequency domain corresponding to the pulses. The tone spacing separating the tones is the reciprocal of the PRI (i.e., 1/PRI) of the pulses. The tones may be indicated by sinusoidal signals in the frequency domain. In order to receive the multiple tones of the periodic RF signal, the LO 120 is set such that each of the sinusoidal signals is down-converted to an IF signal during an acquisition, where the LO frequency of the LO 120 is stepped at each acquisition until all of the sinusoidal signals of the periodic RF signal over the total bandwidth are acquired at the same IF.

Figure 2:
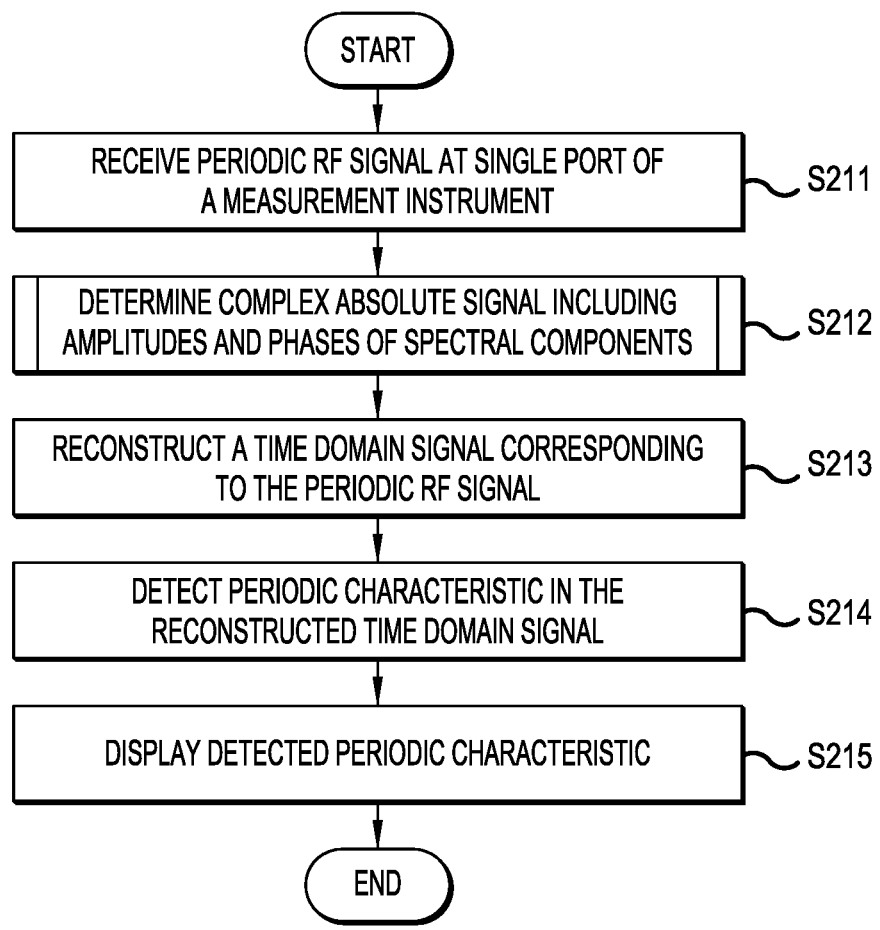
FIG. 2 is a simplified flow diagram showing a process for making time domain measurements of a wideband periodic RF signal using a narrowband measurement instrument operating in the frequency domain, according to a representative embodiment.

FIG. 2 is a simplified flow diagram showing a process for making time domain measurements of a wideband periodic RF signal using a narrowband measurement instrument operating in the frequency domain, according to a representative embodiment. The process may be implemented, for example, by the system 100, discussed above, such as a VNA, an SA, or other similarly configured measurement instrument.

Referring to FIG. 2, a periodic RF signal or SUT is received at a single port of the measurement instrument in block S211. The port corresponds to a coherent receiver of the measurement instrument, as discussed above, where a total bandwidth of the periodic RF signal is wider than the available bandwidth of the coherent receiver. For purposes of illustration, the periodic RF signal may be a pulsed RF signal, having pulses with a predetermined pulse width and PRI in the time domain and frequency tones separated by the reciprocal of the PRI in the frequency domain. The periodic RF signal may include other repetitive characteristics, such as sine waves, without departing from the scope of the present teachings.

The periodic RF signal may be generated by a device under test (DUT), for example, configured to generate periodic RF signals or to output periodic RF signals in response to a stimulus signal. Also, the periodic RF signal may be a wideband signal, having a bandwidth that is wider than the available IF bandwidth of the coherent receiver in the measurement instrument. Generally, to measure the time domain characteristics of such a periodic RF signal, a measurement instrument would need to acquire the entire bandwidth in a single shot with a very high sampling rate, which is typically available for an oscilloscope, for example. However, due to the IF bandwidth limitation, the coherent receiver is able to acquire only a sliver of the total periodic RF signal at a time. Further, the measurement instrument does not have time domain information since its measurements are purely spectrum power.

A complex absolute signal is determined from the received periodic RF signal according to a process indicated by block S212. The complex absolute signal includes amplitudes and phases of the spectral components of the periodic RF signal over its entire bandwidth in the frequency domain. The phase information must be added because the coherent receiver of the measurement instrument is typically only able to measure amplitudes of the periodic RF signal in the frequency domain.

Figure 3:
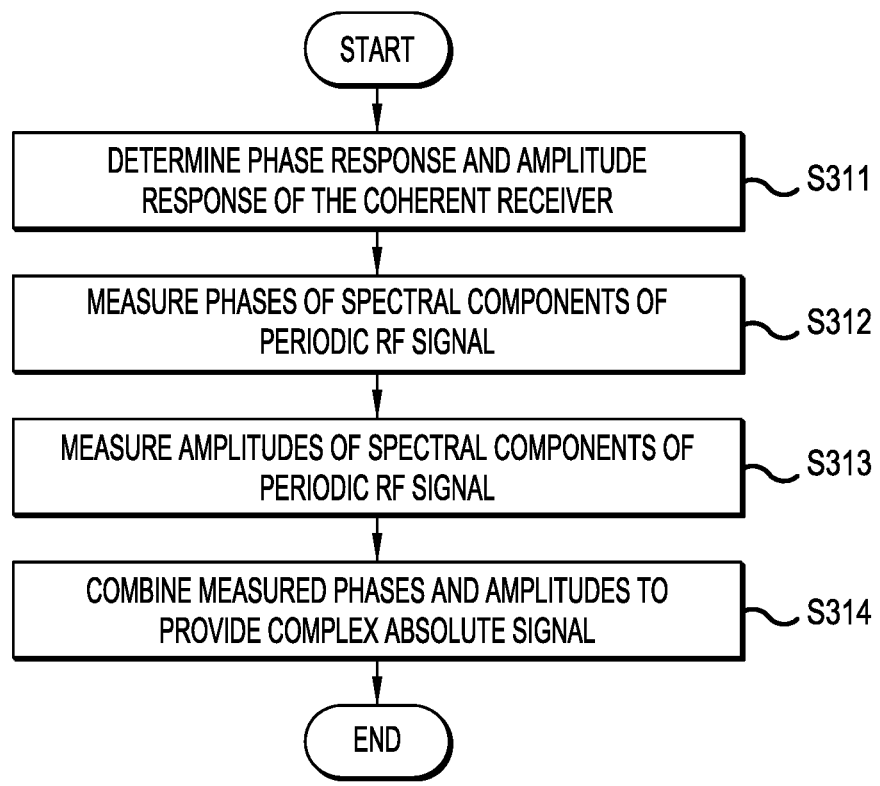
FIG. 3 is a simplified flow diagram showing a process for determining the complex absolute signal using the narrowband measurement instrument operating in the frequency domain, according to a representative embodiment.

FIG. 3 is a simplified flow diagram showing a process for determining the complex absolute signal using the narrowband measurement instrument operating in the frequency domain, according to a representative embodiment. The process may be implemented, for example, by the system 100, discussed above, such as a VNA, an SA, or other similarly configured measurement instrument.

Referring to FIG. 3, phase response and amplitude response of the coherent receiver is determined in block S311. The phase response may be determined, for example, by initially performing phase response calibration of the coherent receiver. Examples of phase response calibration are described by U.S. Patent Application Publication No. 2012/0295548 (Nov. 22, 2012) to Dunsmore, and U.S. Patent Application Publication No. 2014/0306719 (Oct. 16, 2014) to Dunsmore et al., which are hereby incorporated by reference in their entireties.

In an embodiment, the phase response calibration may be performed using a phase reference device, such as a harmonic comb signal generator, for example, that generates a comb signal having multiple frequency tones with a known phase relationship among a fundamental and multiple harmonic frequencies. A phase response of the phase reference device is known with regard to the comb signal due to use of the harmonic comb function. The coherent receiver of the measurement instrument receives the comb signal, and measures an absolute phase response of the phase reference device according to the comb signal. The known phase response of the phase reference device is then removed from the measured phase response to provide a calibrated phase response of the coherent receiver. The known phase response of the comb signal generator may be removed, for example, by dividing the measured phase response by the known phase response of the phase reference device.

An amplitude (power) response of the coherent receiver may be calibrated at the same time, as would be apparent to one skilled in the art. The calibrated amplitude response may be determined based on an absolute amplitude calibration of the coherent receiver. Absolute amplitude is determined in volts, for example, indicating the power of the signal itself, as opposed to relative amplitude, which provides amplitude as a ratio. The absolute amplitude calibration is performed by simultaneously measuring a test signal with the coherent receiver and a reference amplitude-measurement device (not shown), such as a power sensor or other calibrated power-only measurement device, for example. The ratio of the two measurements of the test signal is used to offset the measurement in the coherent receiver, so that its amplitude measurements are the same as those of the reference amplitude-measurement device. Normally with a VNA, for example, a continuous-wave (CW) source (not shown) is used to provide the test signal. The coherent receiver being calibrated and the reference amplitude-measurement device each measures this test signal and the difference between the two measurements is used to correct the coherent receiver, as described above.

In block S312, the phase of each of the spectral components of the received periodic RF signal is measured using the calibrated phase response of the coherent receiver. Also, in block S313, amplitudes of the spectral components are measured using the calibrated amplitude response. The measured phases of the spectral components are combined with the measured amplitudes to provide the complex absolute signal in block S314. The calibration allows the phases of the spectral components of the periodic RF signal to be stitched together over the entire bandwidth of the periodic RF signal, even though the phases are measured asynchronously. The result is a full complex characterization of the periodic RF signal in the frequency domain, measured one spectral line at a time with excellent dynamic range.

Referring again to FIG. 2, a time domain signal corresponding to the periodic RF signal is reconstructed in block S213. For example, the periodic RF signal may be reconstructed by transforming the complex absolute signal from the frequency domain to the time domain by performing an inverse fast Fourier transform (IFFT) on the complex absolute signal.

In block S214, periodic characteristics of the periodic RF signal are detected in the reconstructed time domain signal. For example, the periodic characteristics may include a pulse having a pulse width (e.g., 4 ns pulse) in the periodic RF signal. Notably, by measuring in the frequency domain and transforming to the time domain, benefits of advanced amplitude, phase, and mismatch error correction available for narrowband measurement instruments operating in the frequency domain can be applied to both the frequency and time domain results. At least a portion of the reconstructed periodic RF signal may be displayed in block S215 on a display of the measurement instrument, e.g., showing the detected periodic characteristic. The displayed reconstructed periodic RF signal may be used for testing and analysis of the DUT.

Figure 4B:
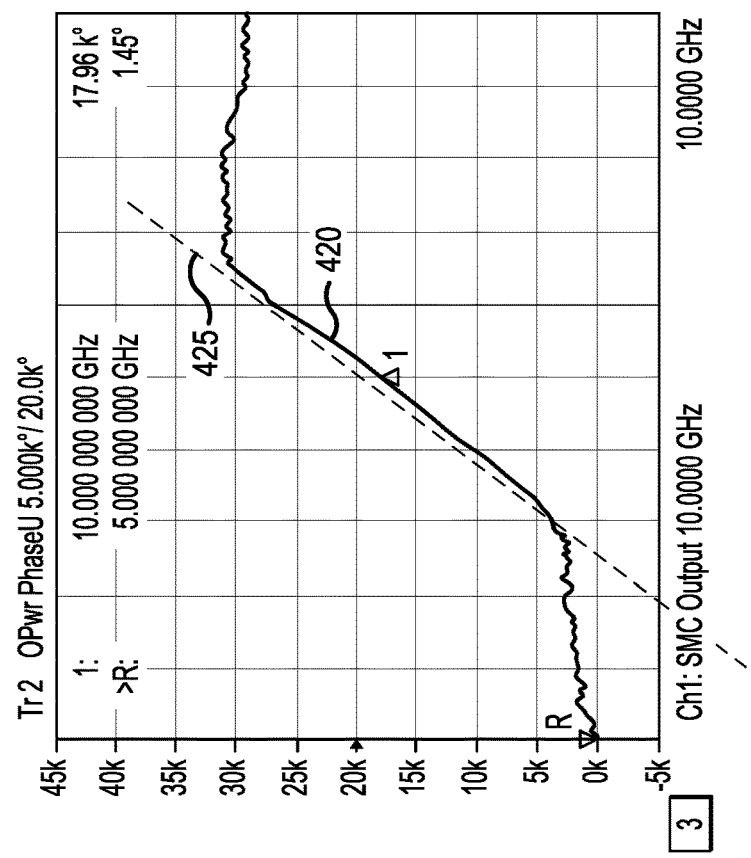
FIG. 4B is a plot showing phase of the complex absolute signal in the frequency domain, according to a representative embodiment.
Figure 4A:
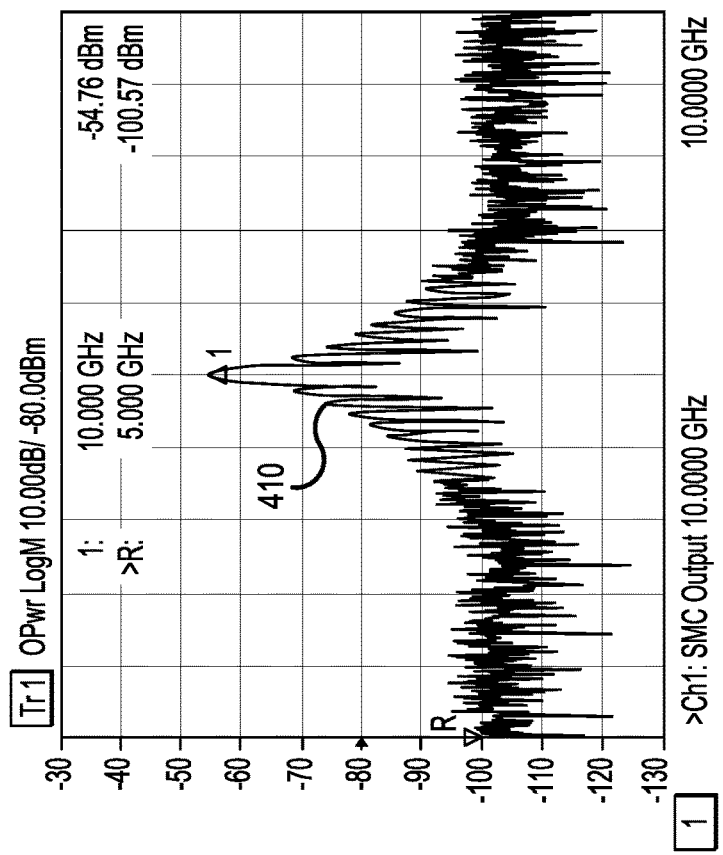
FIG. 4A is a plot showing amplitude of a complex absolute signal in the frequency domain, according to a representative embodiment.

FIG. 4A is a plot showing amplitude of a complex absolute signal in the frequency domain, and FIG. 4B is a plot showing phase of the complex absolute signal in the frequency domain, according to a representative embodiment.

For purposes of illustration, it is assumed that a wideband periodic RF signal is being measured according to embodiments discussed above, where the periodic RF signal has a 10 GHz carrier frequency, and includes pulses having a pulse width of 4 ns and a PRI of for example. Also, the bandwidth of the periodic RF signal is 10 GHz, for example, which is wider than the available IF bandwidth of the coherent receiver in the measurement instrument.

A complex absolute signal corresponding to the periodic RF signal is obtained as discussed above with reference to block S212 of FIG. 2, where the complex absolute signal includes amplitudes and phases of spectral components of the periodic RF signal over the bandwidth of the periodic RF signal in the frequency domain. Referring to FIG. 4A, an amplitude plot 410 shows amplitudes of the illustrative complex absolute signal as a function of frequency, where the complex absolute signal has a 10 GHz bandwidth between 5 GHz and 15 GHz, and a carrier frequency of 10 GHz (the same as the periodic RF signal represented by the complex absolute signal). Marker 1 shows that the amplitude of the complex absolute signal is −54.76 dBm at the carrier frequency, and reference marker R shows that the amplitude of the complex absolute signal is −100.57 dBm at 5 GHz (the lower end of the bandwidth), for example. Referring to FIG. 4B, a phase plot 420 shows phases of the illustrative complex absolute signal as a function of frequency. Marker 1 shows that the phase of the complex absolute signal is 17.96 k degrees at the carrier frequency, and reference marker R shows that the phase of the complex absolute signal is 1.45 k degrees at 5 GHz, for example. The phase plot 420 includes a substantially linear portion of phase over frequency, indicated by dashed line 425, between about 8 GHz and about 10 GHz, for example. The linear portion of phase over frequency occurs at frequencies where the complex absolute signal is phase shifted (delayed) by the same amount. Together, the amplitude plot 410 and the phase plot 420 provide a complex periodic RF signal in the frequency domain.

Figure 4C:
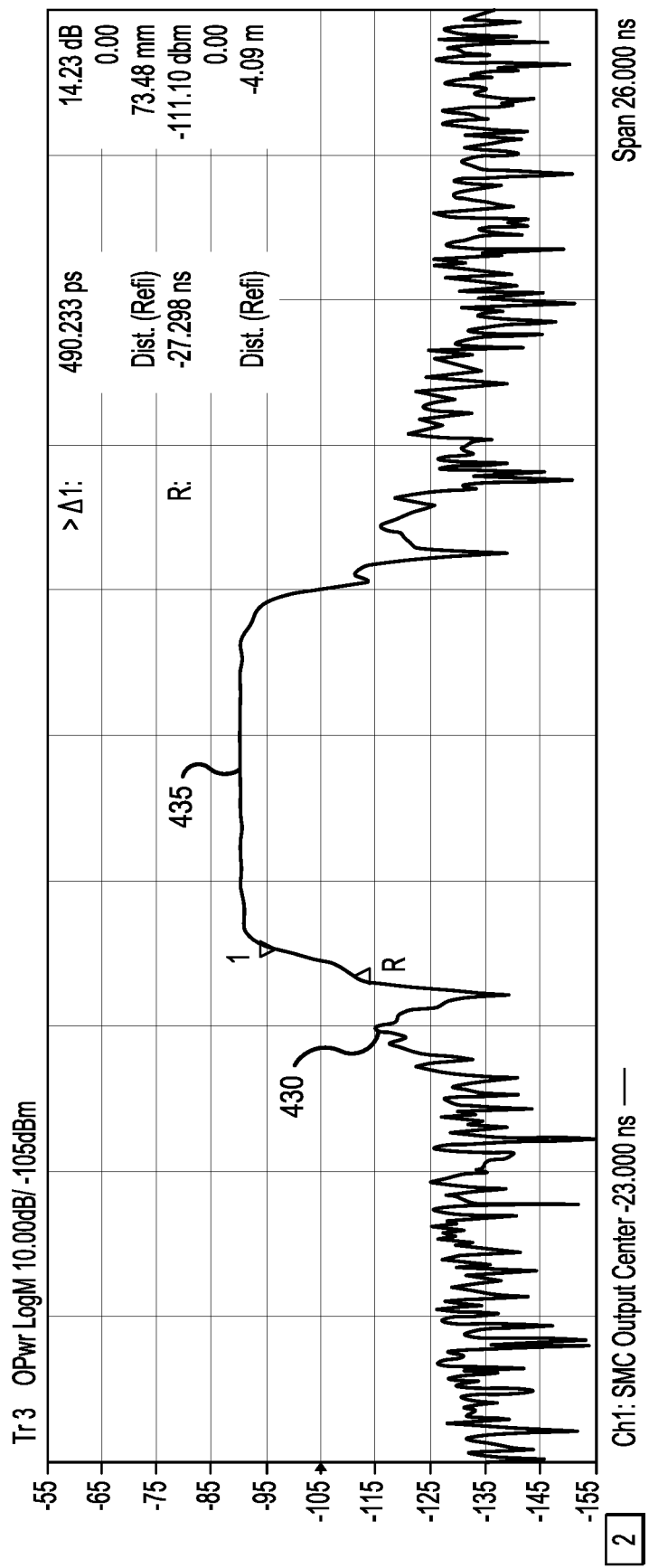
FIG. 4C is a plot showing a reconstructed periodic RF signal in the time domain corresponding to the amplitude and phase of the complex absolute signal, according to a representative embodiment.

FIG. 4C is a plot showing the periodic RF signal reconstructed in the time domain corresponding to the amplitude and phase of the complex absolute signal, according to a representative embodiment. Referring to FIG. 4C, plot 430 shows amplitude of the reconstructed periodic RF signal over time, including a pulse 435 having a pulse width of 4 ns, as mentioned above. The time domain representation of the reconstructed periodic RF signal shown by the plot 430 is obtained by applying an IFFT to the frequency domain representation of the complex absolute signal shown by the amplitude and phase plots 410 and 420. Accordingly, signal characteristics, such as rise time, fall time, pulse width, pulse shape and transients of the pulse 435 can be measured.

For example, the plot 430 shows the time domain representation of the 4 ns pulse width, which ordinarily cannot be measured with direct time domain sampling by the measurement instrument. However, as shown by the amplitude and phase plots 410 and 420, all the information is present in the frequency domain according to the various embodiments. For example, with regard to measuring rise time at the start of the pulse 435, reference marker R shows an amplitude of −111.10 dBm at 27.29 ns, and marker 1 shows an amplitude of −96.87 dBm at 27.78 ns, for a rise time of about 490 ps. This level of precision is not attainable in the normal pulse mode of the narrowband measurement instrument. As mentioned above, the measurement instrument does not have time domain information since it measures spectrum power. So, according to the embodiments, phase information in the frequency domain is preserved, so that the IFFT may be applied to measure the time domain characteristics.

The embodiments have been described above with reference to a periodic RF signal received at a single port of the measurement instrument. However, as previously mentioned, the measurement instrument may have multiple ports corresponding to multiple coherent receivers, enabling simultaneous measurement of multiple periodic RF signals using the same processes. As a result, the measurement instrument may measure pulses in multiple reconstructed periodic RF signals in the time domain. When the periodic RF signals are the same, the corresponding pulses may be measured for comparison purposes, where the relative amplitude, phase, delays and shapes of the pulses are measurable to picosecond levels in the corresponding reconstructed periodic RF signals, obtained as discussed above. Also, for example, phase shift between two of the same periodic RF signals received at two different ports of the measurement instrument can be determined by the difference in phase angles in the linear portions of the phases over frequency, respectively, in the corresponding complex absolute signals. The different reconstructed periodic RF signals may be displayed simultaneously in the time domain, enabling direct comparison of the amplitudes over time.

Notably, when the periodic RF signal is applied to one port of the measurement instrument, there is no reference signal against which to measure. Therefore, the beginning time of the pulse 435 is arbitrary, and may change by changing basic parameters of the measurement instrument. In FIG. 4C, for example, the reference marker R shows the beginning of the pulse 435 at −27.298 ns, although this would change with changed acquisition parameters. This is due to the arbitrary linear portion of the phase versus frequency of the complex absolute signal shown in FIG. 4B. By removing the linear portion, the pulse 435 will begin at time zero for each measurement, which simplifies the displayed results.

For example, the linear portion may be characterized using least squares fitting or weighted least squares fitting, and removed from the phase portion of the complex absolute signal. In an embodiment, upper and lower frequencies are selected to define a frequency span of interest corresponding to the linear portion (e.g., about 8 GHz to about 10 GHz), the upper and lower frequencies corresponding to spectral lines of the complex absolute signal. A line is determined that best fits the phase data of the phase plot 420 using least squares fitting (i.e., linear regression), having a linear slope. The linear regression provides a line that minimizes mean-squared error of phase versus frequency at all or substantially all of points of the phase plot 420 within the frequency span of interest. Alternatively, the line that best fits the phase data of the phase plot 420 may be determined using weighted least squares fitting (i.e., weighted linear regression), having a linear slope. Using weighted linear regression, weights are first assigned to the points of the phase plot 420, e.g., based on the amplitudes of the corresponding spectral lines in the complex absolute signal, indicated by the amplitude plot 410. Generally, the greater the amplitude of the complex absolute signal at a particular frequency, the more weight is assigned to the phase value point on the phase plot 420 at that frequency. The points where the amplitude is highest are weighed more heavily because the corresponding phase data is considered more reliable, since signal to noise ration (SNR) is higher and thus variance is lower. Thus, weighted linear regression similarly provides a line that minimizes mean-squared error of phase versus frequency at all or substantially all of points of the phase plot 420 within the frequency span of interest. The best fit line determined by linear regression or weighted linear regression is shown in FIG. 4B as the dashed line 425. Application of linear regression and weighted linear regression to determine a best fit line generally is well known to one skilled in the art.

Figure 5B:
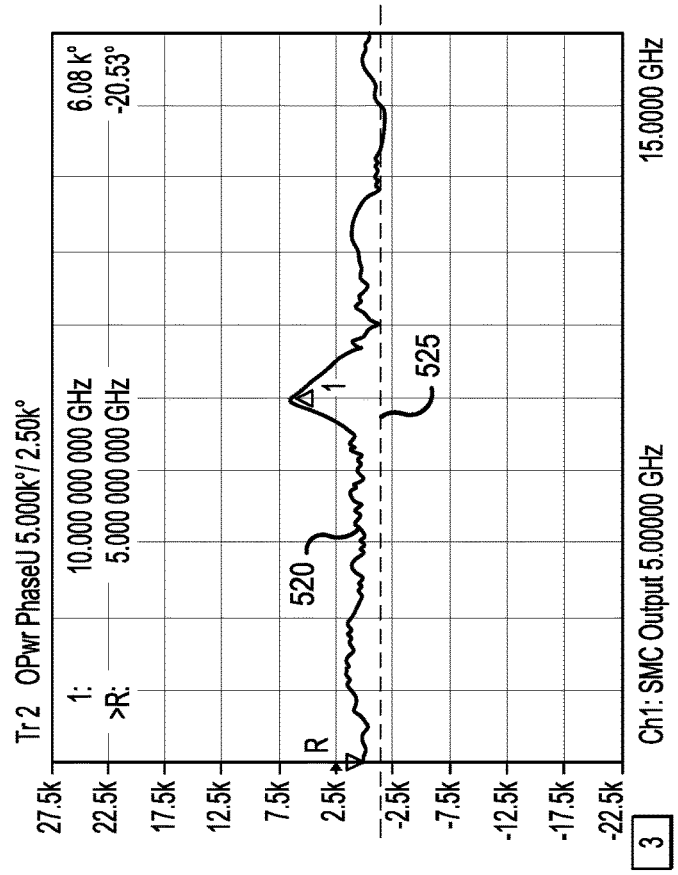
FIG. 5B is a plot showing phase of the complex absolute signal in the frequency domain with the linear phase portion removed, according to a representative embodiment.

As mentioned above, once the linear phase portion of the phase plot 420 has been characterized, it may be removed from the frequency domain signal. In this regard, FIG. 5A is a plot showing amplitude of a complex absolute signal in the frequency domain, and FIG. 5B is a plot showing phase of the complex absolute signal in the frequency domain with the linear phase portion removed, according to a representative embodiment.

Figure 5A:
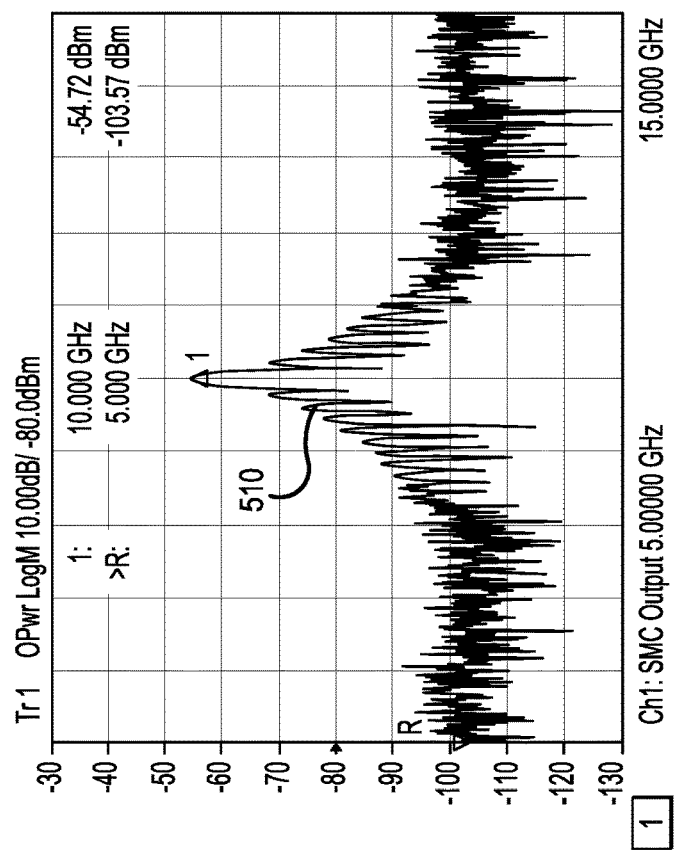
FIG. 5A is a plot showing amplitude of a complex absolute signal in the frequency domain with the linear phase portion removed, according to a representative embodiment.

An amplitude plot 510 in FIG. 5A is substantially the same as the amplitude plot 410 in FIG. 4A, indicating that removing the linear phase has no practical effect on the amplitude of the complex absolute signal. A phase plot 520 in FIG. 5B shows phases of the illustrative complex absolute signal as a function of frequency after the linear phase portion of the phase plot 420 has been removed. Dashed line 525 corresponds to the dashed line 425 in FIG. 4B, such that the phase plot 520 shows deviation from linear phase of the phase versus frequency signal indicated by the phase plot 420. Marker 1 shows that the phase of the complex absolute signal is 6.08 k degrees at the carrier frequency.

Figure 5C:
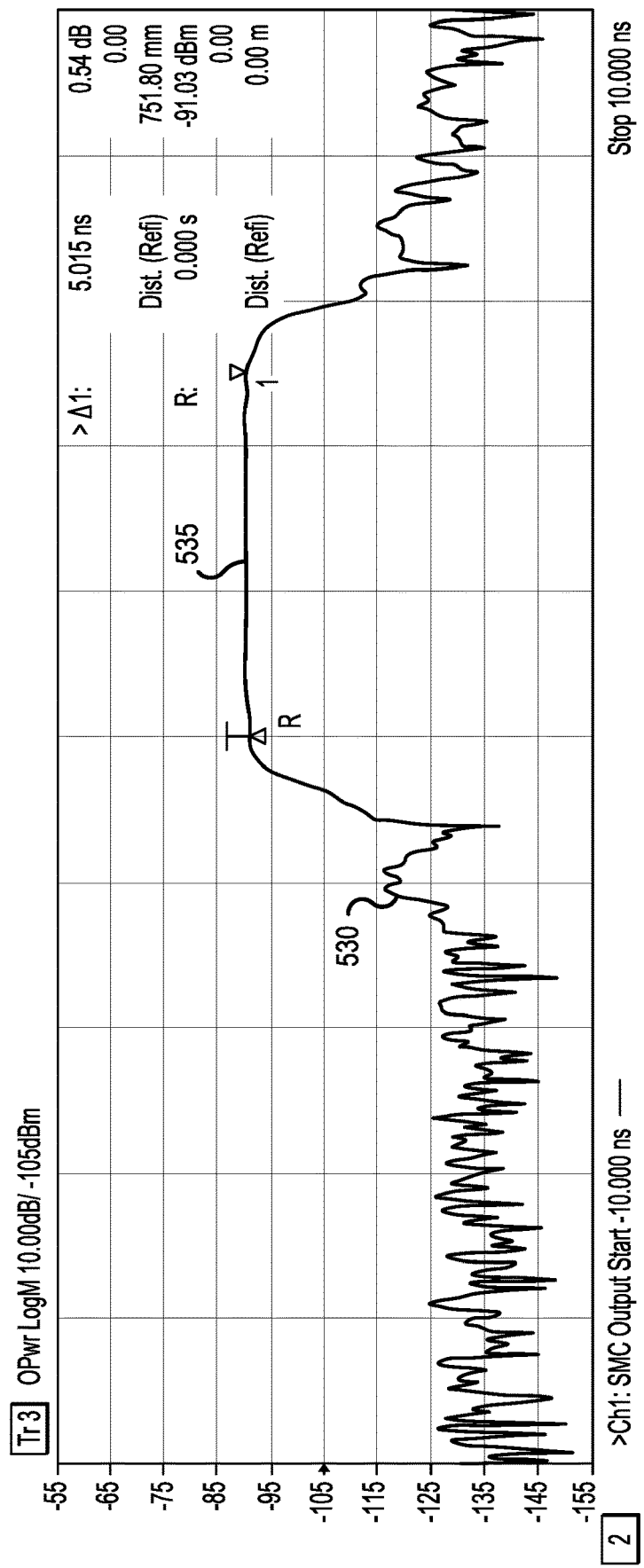
FIG. 5C is a plot showing a reconstructed periodic RF signal in the time domain corresponding to the amplitude and phase of the complex absolute signal, according to a representative embodiment.

FIG. 5C is a plot showing a reconstructed periodic RF signal in the time domain corresponding to the amplitude and phase of the complex absolute signal, according to a representative embodiment, where the linear phase portion has been removed. Referring to FIG. 5C, plot 530 shows amplitude of the reconstructed periodic RF signal over time, including a pulse 535 having a pulse width of 4 ns, as mentioned above. Again, the time domain representation of the reconstructed periodic RF signal shown by the plot 530 is obtained by applying an IFFT to the frequency domain representation of the complex absolute signal shown by the amplitude and phase plots 510 and 520. With regard to the pulse 535, after removing the linear portion of phase over frequency from the complex absolute signal, the reference marker R showing the beginning of the pulse 535 on the time domain plot 530 is now at zero seconds, where the reference marker R shows an amplitude of −91.03 dBm.

In an embodiment, the linear phase portion has been removed, an arbitrary phase slope may be added to or subtracted from the phases of the complex absolute signal. Doing so translates the center of the reconstructed time domain signal forward or backward with respect the time zero.

While the invention has been illustrated and described in detail in the drawings and foregoing description, such illustration and description are to be considered illustrative or exemplary and not restrictive; the invention is not limited to the disclosed embodiments.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is no to be restricted except within the scope of the appended claims.

The invention claimed is:

1. A method of making time domain measurements of a periodic radio frequency (RF) signal using a narrowband measurement instrument operating in a frequency domain, wherein the measurement instrument comprises a plurality of receivers for measuring pulses in a plurality of reconstructed periodic RF signals in a time domain, wherein the plurality of reconstructed periodic RF signals are displayable simultaneously in the time domain, enabling direct comparison of amplitudes over time, the method comprising:

receiving the periodic RF signal at a receiver of the plurality of receivers in the frequency domain, wherein an entire bandwidth of the periodic RF signal is wider than an available bandwidth of each receiver of the plurality of receivers;

determining a phase response of the receiver;

determining an amplitude response of the receiver;

measuring phases of spectral components of the periodic RF signal using the phase response of the receiver;

measuring amplitudes of the spectral components of the periodic RF signal using the amplitude response of the receiver;

determining a complex absolute signal from the periodic RF signal by combining the measured phases with the measured amplitudes, such that the complex absolute signal comprises the amplitudes and the phases of the spectral components of the periodic RF signal across the entire bandwidth of the periodic RF signal in the frequency domain;

reconstructing the periodic RF signal in a time domain by transforming the complex absolute signal from the frequency domain to the time domain;

detecting at least one characteristic of the periodic RF signal in the reconstructed periodic RF signal in the time domain; and displaying the at least one detected characteristic on a display.

2. The method of claim 1, wherein transforming the complex absolute signal from the frequency domain to the time domain comprises performing an inverse fast Fourier transform (IFFT) on the complex absolute signal.

3. The method of claim 1, wherein the at least one characteristic comprises a pulse.

4. The method of claim 1, wherein:

determining a phase response of the receiver comprises performing a phase response calibration of the receiver; and determining the amplitude response of the receiver comprises performing an absolute amplitude calibration of the receiver.

5. The method of claim 4, wherein performing the phase response calibration comprises:

generating a comb signal with multiple frequency tones using a phase reference device, the frequency tones having a known phase relationship, and applying the comb signal to the receiver;

measuring a phase response of the phase reference device at the receiver using the comb signal; and removing a known phase response of the phase reference device from the measured phase response by dividing the measured phase response by the known phase response to determine the phase response of the receiver.

6. The method of claim 1, further comprising:

determining a linear portion of the phases of the spectral components in the complex absolute signal; and removing the determined linear portion of the phases of the spectral components from the complex absolute signal.

7. The method of claim 6, further comprising:

adding or subtracting an arbitrary phase slope to or from the phases of the complex absolute signal to translate a center of the reconstructed periodic RF signal forward or backward with respect time zero.

8. A system operating in a frequency domain for making time domain measurements of a periodic radio frequency (RF) signal, the system comprising:
   a coherent receiver of a plurality of coherent receivers configured to measure pulses in a plurality of reconstructed periodic RF signals in a time domain, wherein the plurality of reconstructed periodic RF signals are displayable simultaneously in the time domain, enabling direct comparison of amplitudes over time, wherein the coherent receiver is configured to receive the periodic RF signal in the frequency domain, wherein an entire bandwidth of the periodic RF signal is wider than an available bandwidth of the coherent receiver, and wherein the received periodic RF signal comprises a plurality of spectral components; and
   a processing unit comprising a processor device and a memory storing instructions that, when executed by the processor device, cause the processing unit to:
   determine a phase response of the coherent receiver;
   determine an amplitude response of the coherent receiver;
   measure phases of spectral components of the periodic RF signal using the phase response of the coherent receiver;
   measure amplitudes of the spectral components of the periodic RF signal using the amplitude response of the coherent receiver;
   determine a complex absolute signal from the periodic RF signal by combining the measured phases with the measured amplitudes of the spectral components of the periodic RF signal across the entire bandwidth of the periodic RF signal in the frequency domain;
   reconstruct the periodic RF signal in the time domain by transforming the complex absolute signal from the frequency domain to the time domain;
   detect at least one characteristic of the periodic RF signal in the reconstructed periodic RF signal in the time domain; and
   cause the at least one characteristic to be displayed on a display.

9. The system of claim 8, wherein the instructions further cause the processing unit to transform the complex absolute signal from the frequency domain to the time domain by performing an inverse fast Fourier transform (IFFT) on the complex absolute signal.

10. The system of claim 8, wherein the at least one characteristic comprises a periodic characteristic in the reconstructed periodic RF signal.

11. A non-transitory computer readable medium storing instructions for making time domain measurements of a periodic radio frequency (RF) signal received through a narrowband coherent receiver of a plurality of narrowband coherent receivers in a narrowband measurement instrument operating in a frequency domain for measuring pulses in a plurality of reconstructed periodic RF signals in a time domain, wherein the plurality of reconstructed periodic RF signals are displayable simultaneously in the time domain, enabling direct comparison of amplitudes over time, wherein an entire bandwidth of the periodic RF signal is wider than available bandwidth of each narrowband coherent receiver of the plurality of narrowband coherent receivers, wherein the instructions, when executed by a processor, cause the processor to execute steps comprising:
   determining a phase response of the narrowband coherent receiver receiving the periodic RF signal in the frequency domain;
   determining an amplitude response of the narrowband coherent receiver receiving the periodic RF signal in the frequency domain;
   measuring phases of spectral components of the periodic RF signal using the phase response of the narrowband coherent receiver;
   measuring amplitudes of the spectral components of the periodic RF signal using the amplitude response of the narrowband coherent receiver;
   determining a complex absolute signal from the periodic RF signal received in the frequency domain at the narrowband coherent receiver by combining the measured phases with the measured amplitudes, such that the complex absolute signal comprises the amplitudes and the phases of the periodic RF signal across the entire bandwidth of the periodic RF signal in the frequency domain;
   reconstructing the periodic RF signal in a time domain by transforming the complex absolute signal from the frequency domain to the time domain;
   detecting at least one characteristic of the periodic RF signal in the reconstructed periodic RF signal in the time domain; and
   causing the at least one characteristic to be displayed on a display.

12. The non-transitory computer readable medium of claim 11, wherein transforming the complex absolute signal from the frequency domain to the time domain comprises performing an inverse fast Fourier transform (IFFT) on the complex absolute signal.

13. The non-transitory computer readable medium of claim 11, wherein the at least one characteristic comprises a pulse.

14. The non-transitory computer readable medium of claim 11, wherein the instructions stored thereon further cause the processor to
   perform a phase response calibration of the narrowband coherent receiver to determine the phase response; and
   perform an absolute amplitude calibration of the narrowband coherent receiver to determine the amplitude response.

15. The non-transitory computer readable medium of claim 14, wherein the instructions stored thereon further cause the processor to perform the phase response calibration by:
   generating a comb signal with multiple frequency tones using a phase reference device, the frequency tones having a known phase relationship, and applying the comb signal to the narrowband coherent receiver;
   measuring a phase response of the phase reference device at the narrowband coherent receiver using the comb signal; and
   removing a known phase response of the phase reference device from the measured phase response by dividing the measured phase response by the known phase response to determine the phase response of the narrowband coherent receiver.

16. The non-transitory computer readable medium of claim 11, wherein the instructions stored thereon further cause the processor to execute steps comprising:
   determining a linear portion of the phases of the spectral components in the complex absolute signal; and
   removing the determined linear portion of the spectral components from the complex absolute signal.

17. The non-transitory computer readable medium of claim 16, wherein the instructions stored thereon further cause the processor to execute steps comprising:

adding or subtracting an arbitrary phase slope to or from the phases of the complex absolute signal to translate a center of the reconstructed periodic RF signal forward or backward with respect time zero.

* * * * *